United States Patent [19]

Fisher et al.

[11] 4,030,084
[45] June 14, 1977

[54] SUBSTRATE BIAS VOLTAGE GENERATED FROM REFRESH OSCILLATOR

[75] Inventors: Edwin P. Fisher, N. Abington; Robert B. Johnson, Billerica, both of Mass.

[73] Assignee: Honeywell Information Systems, Inc., Waltham, Mass.

[22] Filed: Nov. 28, 1975

[21] Appl. No.: 636,276

[52] U.S. Cl. .................... 340/173 R; 340/173 DR
[51] Int. Cl.² ........................................ G11C 11/40
[58] Field of Search ................. 340/173 DR, 173 R

[56] References Cited
UNITED STATES PATENTS 3,651,494  3/1972  Lynch .................. 340/173 DR
3,760,380  9/1973  Hoffmann ............... 340/173 DR

*Primary Examiner*—Terrell W. Fears
*Attorney, Agent, or Firm*—Nicholas Prasinos; Ronald T. Reiling

[57] ABSTRACT

Apparatus and method for generating substrate bias for the refresh apparatus of volatile memory elements associated with data processing units. A refresh oscillator in the refresh apparatus is utilized to drive a chopper circuit or high level driver in combination with a rectifier network for obtaining raw negative voltage. The raw voltage is filtered and adjusted to the correct value on the metal oxide semiconductor (MOS) memory board and distributed to each random access memory (RAM).

6 Claims, 7 Drawing Figures

SUBSTRATE BIAS VOLTAGE GENERATED FROM REFRESH OSCILLATOR

BACKGROUND OF THE INVENTION

1. Field of the Invention

This invention relates generally to data processing systems and more particularly to computer memory systems wherein the storage of information is maintained by physical properties which are subject to deterioration.

2. Description of the Prior Art

Electronic data processing systems have grown since their inception in size, speed and complexity. With their growth there has been an ever increasing demand for greater memory storage capacity which at the same time is low in cost and weight and occupies a minimum of space. To answer these demands, there is a trend to an ever increasing use of metal-oxide-semiconductor (MOS) memory elements. The memory elements themselves are typically composed of several interacting devices in which the formation is maintained in the form of a stored charge. Because of leakage currents and other effects, this charge must be periodically restored or refreshed to prevent loss of the information.

Thus, the physical property, which is the analog of the information, must be periodically refreshed. Several techniques and apparatuses have been devised for controlling the refreshing of these volatile memory elements associated with the data processing units. One typical such refresh invention is disclosed in U.S. Pat. No. 3,760,379 issued Sept. 18, 1973 to C. M. Nibby, et al., entitled "Apparatus and Method for Memory Refresh Control" and assigned to the same assignee as the instant application and incorporated by reference.

The metal-oxide-semiconductor random access memories (MOS RAM) have various power requirements which differ depending upon the MOS RAM utilized; however, there is usually one power requirement common to all MOS RAM arrays. This requirement comprises a substrate bias which is generally provided from the power supply of the memory system. Referring to FIG. 2 there is shown a prior art MOS memory refresh system with its power supply. A multivoltage power supply 201 generates and supplies 3 different voltage values to the MOS memory system 200. The VDD voltage supply 202 supplies a typical voltage of plus 12 volts to MOS memory array 206. The VCC voltage supply 203 provides a voltage of plus 5 volts to the MOS memory 206 and also to the Refresh Clock and Logic Circuits 205, and Memory Control and Interface Logic Circuits 207. The minus VBB bias supply 204 provides minus 5 volts to the MOS memory array 206. These voltages are utilized within the memory system 200 to generate the refresh control and refresh clock requirements.

With the advent of mini computers there is an ever increasing emphasis on smaller weight and smaller space requirements and on lower costs. Power supplies in general tend to be heavy and bulky. It is therefore desirable to reduce the size, weight and complexity of the power supply for the refresh control memory system.

OBJECTS OF THE INVENTION

It is therefore a primary object of this invention to provide an improved power supply system for the refresh control of the MOS RAM memory.

Another object of the invention is to provide an improved power supply system for the MOS memory refresh system which is smaller, lighter and cheaper to manufacture.

Still a further object of the instant invention is to provide a power supply system for the MOS memory refresh system which generates at least one voltage as a byproduct of the refresh clock and logic circuits.

These and other objects of the invention will become apparent from the description of a preferred embodiment of the invention when read on conjunction with the drawings contained herewith.

SUMMARY OF THE INVENTION

The foregoing objects of the instant invention are achieved by utilizing the refresh oscillator of the MOS memory and an address counter, both available in the refresh control circuitry together with a chopper rectifier and filter circuit to generate the negative bias as a byproduct of the refresh operation.

Referring to FIG. 1, a high level driver circuit 103 (commercially designated as Ser. No. 75365 and commercially available from such semiconductor manufacturers as Texas Instruments Inc., is driven from the refresh oscillator 101 via address counter 102. The high level driver 103 is typically supplied with battery voltages of plus 5 and 12 volts respectively at terminals ZVPO5B and ZVP12B. The high level driver circuit 103 is typically a transistor switch and provides a transition from 0 volts to approximately plus 12 volts which is utilized to drive the chopper rectifier circuit 104 which is then filtered through the filter circuit 105 and supplied to the MOS memory array 106.

DETAILED DESCRIPTION OF THE INVENTION

Figure 1:
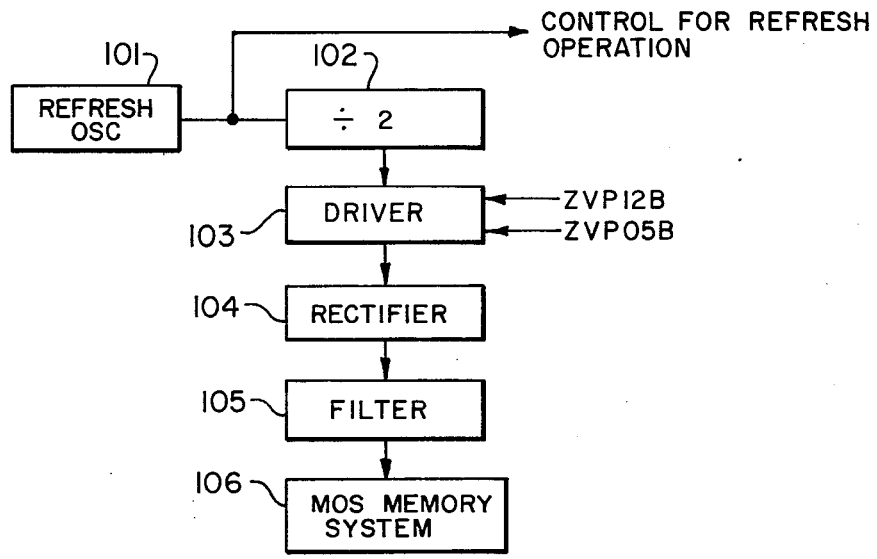
FIG. 1 is a block diagram of the invention.
Figure 2:
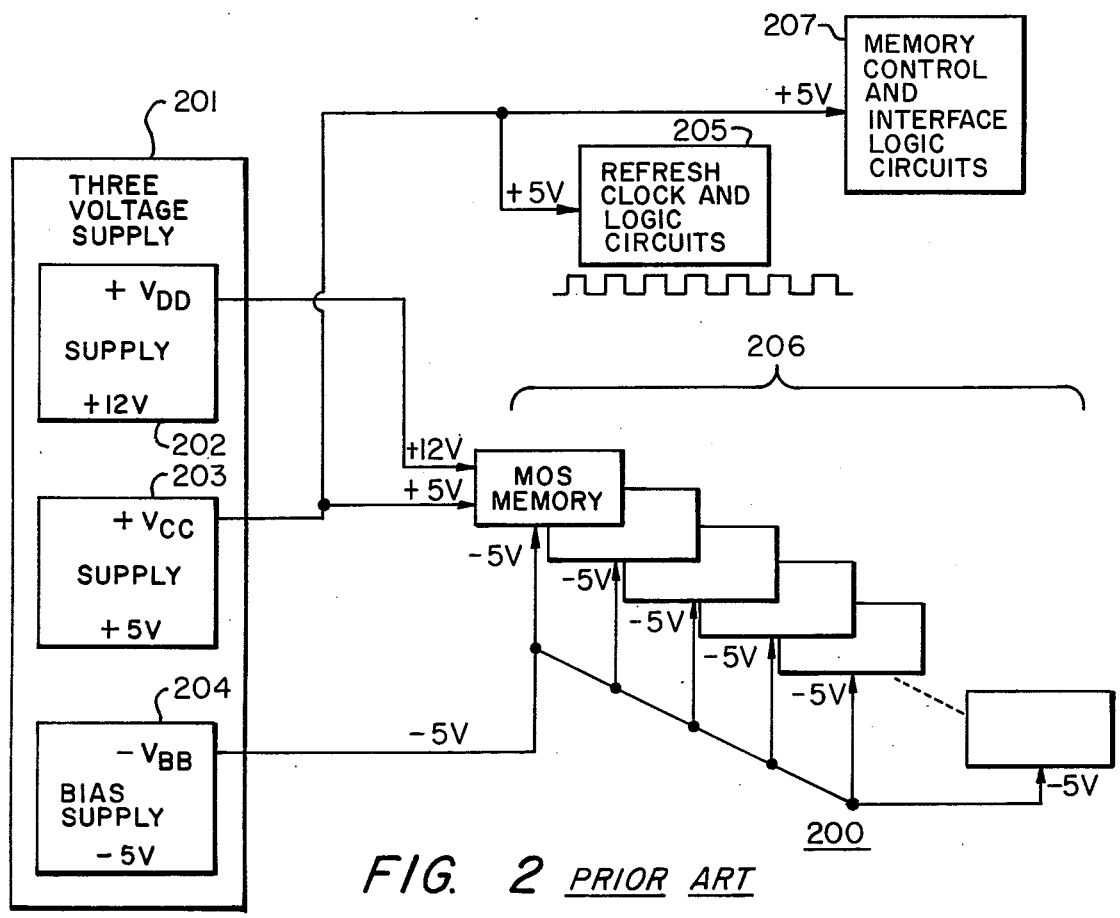
FIG. 2 is a prior art block diagram of a refresh control system.
Figure 3:
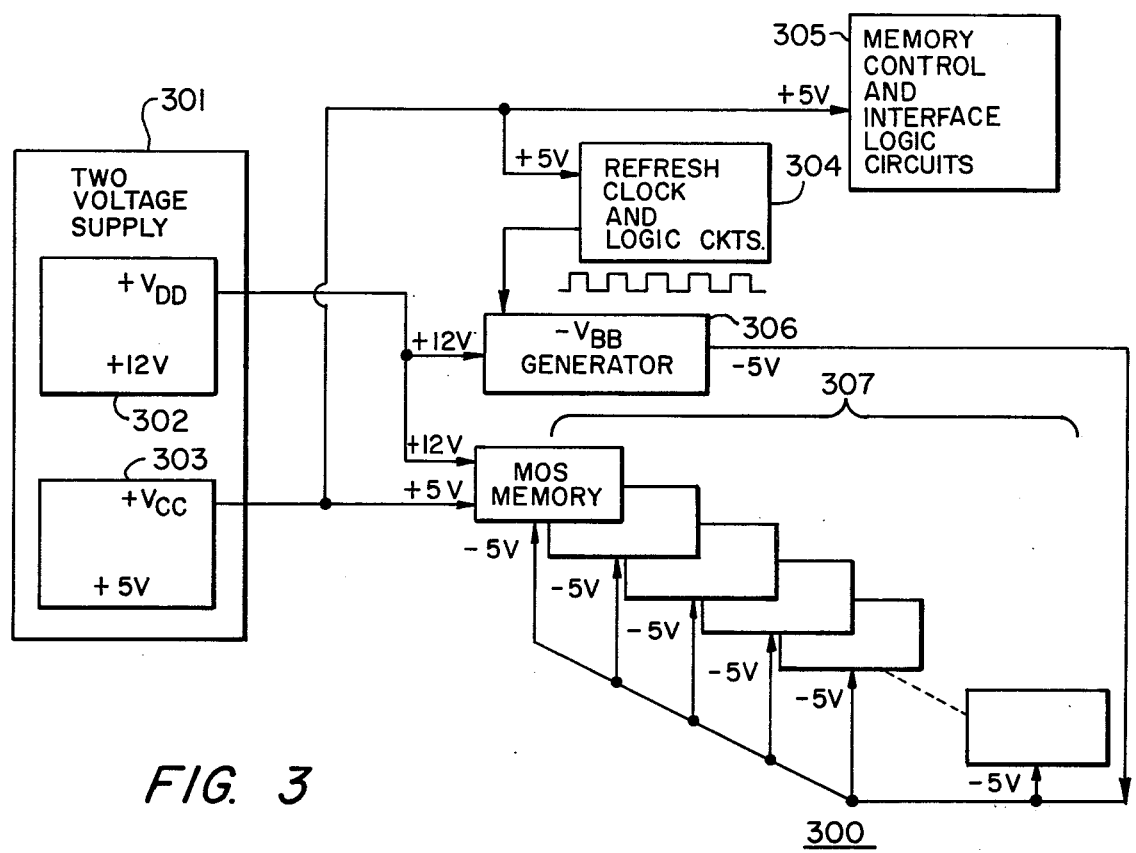
FIG. 3 is a block diagram of the refresh control system of the invention.

Referring to FIG. 3, a multi-voltage power supply 301 is comprised of a plus VDD supply for providing plus 12 volts to the memory refresh control system 300, and a VCC voltage supply for providing plus 5 volts to the memory refresh control system. The negative 5 volts for the memory refresh control system is generated by minus VBB Generator 306 utilized in conjunction with the Refresh Clock and Logic Generator 304 to generate the minus 5 volt supply as a byproduct of the refresh clock circuitry. Plus 12 volts is supplied from the plus VDD supply 302 to the MOS Memory 307 and to the minus VBB Generator 306. Also, plus 5 volts is supplied from the plus VCC supply 303 to the Refresh Clock and Logic Circuitry 304 and to the Memory Control and Interface Logic Circuitry 305. Utilizing the Refresh Clock Oscillator 101 and Address Counter 102 for a switch time (see FIG. 1) the minus VBB Generator 306 provides a minus 5 volts for the MOS Memory 307. (See discussion infra and FIGS. 4 and 5 for details). Note by comparison to the prior art MOS refresh system shown on FIG. 2 that not only has the multivoltage supply 301 been simplified and reduced in size and weight, but the bussing of this voltage from the power supply to the MOS memory array has been eliminated. The 2-voltage power supply 301 supplies only a plus 12 volts and a plus 5 volts, with the minus 5 volt bias being internally generated in the MOS memory system 300. The plus 12 volts and plus 5 volts are bussed from the multi voltage power supply 301 to the MOS refresh control system 300. However, the minus 5 volt bias does not require bussing since it is already resident in the refresh control system 300. In addition to relieving the negative voltage requirement from the battery back-up package, the invention also relieves the negative voltage (battery) requirement from the main power supply and additionally frees up a back-board pin.

Figure 4:
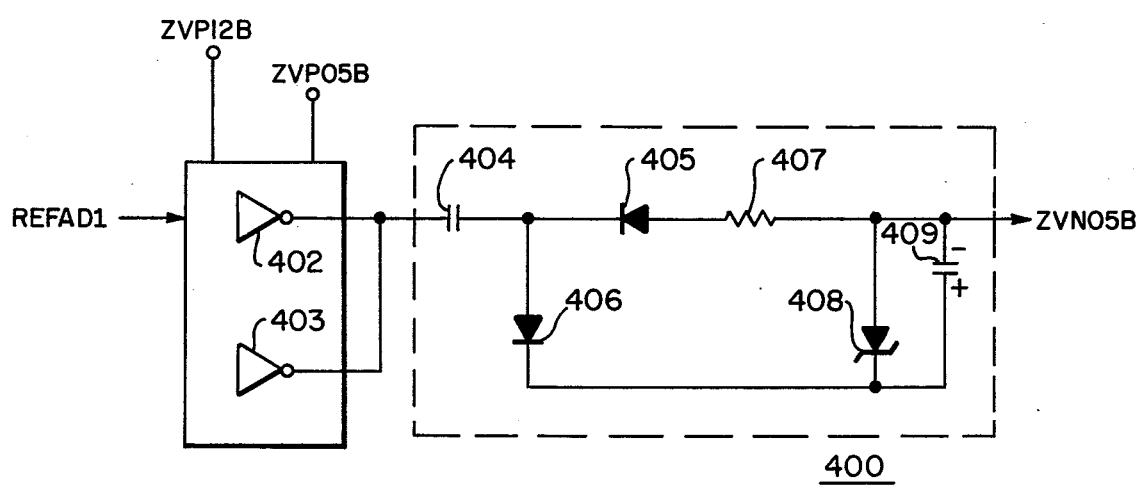
FIG. 4 is a detailed schematic diagram of the chopper, driver, rectifier and filter circuits.

Referring now to FIG. 4, there is a more detailed showing of the schematic circuitry for the substrate bias generation. The chopper-rectifier circuit 400 is driven from first refresh address REFAD1 by utilizing a commercially available Ser. No. 75365 high level driver circuit 401 which is supplied with battery voltages of plus 12 and plus 5 volts respectively via terminals ZVP12B and ZVPO5B. The output of the high level driver system 401 is a transition from 0 volts to approximately plus 12 volts. This voltage signal is utilized to drive the chopper-rectifier circuit 400. The chopper circuit is typically comprised of the Ser. No. 75365 driver transistor 401, a capacitor 404, which may typically be a 4.7 microfarad tantalum capacitor, and a diode 406. The rectifier circuit is typically comprised of a diode 405 coupled in series to a resistor 407, and includes a Zener diode 408 which is coupled to the resistor 407 and the diode 406. A filter capacitor 409 is coupled across the Zener diode 408. The required minus 5 volts is supplied at the output ZVNO5B. (The operation of this circuit will be described in detail infra referring to simplified equivalent circuit diagrams 5A-5C).

Figure 5A:
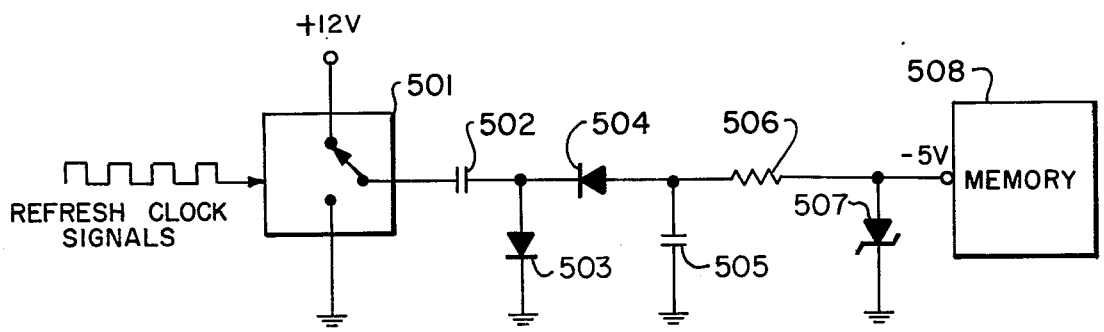
FIGS. 5A–5C are simplified schematic circuit diagrams of the invention.
Figure 5B:
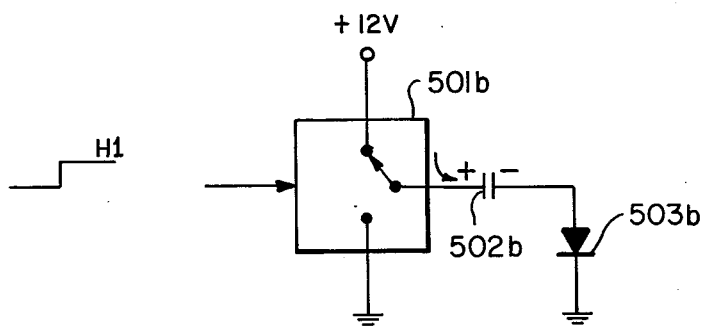
Figure 5C:
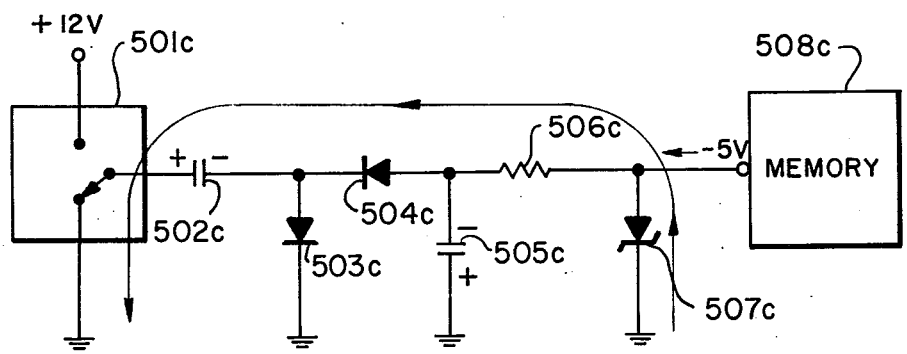

Referring now to FIGS. 5A-5C, the refresh clock signals oscillating approximately every 60 microseconds causes a switch circuit 501, which may typically be the Ser. No. 75365 commercially available transistor circuit previously noted to switch every 60 microseconds. A chopper circuit comprised of switch 501, a capacitor 502 coupled to the switch 501 and to one terminal of diode 503 is thus driven to switch 501 to alternatively charge and discharge capacitor 502. The rectifier circuit which is comprised of a diode 504 coupled to capacitor 502 and also coupled to diode 503 rectifies the voltage as capacitor 502 discharges to ground. Capacitor 505, coupled to diode 504 and resistor 506 filters the current during this discharge, while Zener diode 507 also coupled to resistor 506 and to ground, clamps the voltage to approximately minus 5 volts. The minus 5 volts thus generated by the chopper-rectifier-filter circuit is provided to memory 508. (FIG. 5B and FIG. 5C are portions of FIG. 5A and their components are similar and designated by the same numerals as in FIG. 5A with the exception that a reference letter is also attached to each reference numeral). Referring to FIG. 5B a portion of FIG. 5A is shown wherein the switch 501b connects the capacitor 502b to the plus 12 volts source thus charging capacitor 502b to plus 12 volts. When the switch goes negative (FIG. 5C), the positive end of capacitor 502c is connected to ground and current flows from diode 504c in the direction of the arrow and charges capacitor 502c in the negative direction. Any load current that is connected to the substrate bias generator, such as for example the memory 508c, is then refurbished as the switch switches. The series of events taking place, looking at FIG. 5C from the memory 508c is as follows: (a) the Zener diode 507c clamps the voltage to approximately minus 5 volts; (b) the capacitor 505c filters the current; and, (c) the diode 504c rectifies the voltage.

Having shown and described a preferred embodiment of the invention, those skilled in the art will realize that many variations and modifications can be made to produce the described invention and still be within the spirit and scope of the claimed invention.

What is claimed is:

1. In a metal-oxide semiconductor (MOS) memory array associated with a data processing unit wherein information in groups of said (MOS) memory elements is to be refreshed by a refresh means, apparatus for providing negative bias to said (MOS) memory array comprising:
   a. first means for providing a plus voltage to said MOS memory array relative to ground;
   b. second means in said (MOS) memory array coupled to said first means for providing rectangular wave refresh clock signals;
   c. third means responsive to the rectangular wave refresh clock signals for switching between the plus voltage and ground;
   d. fourth means coupled to said third means for alternately accumulating the positive charge and releasing the positive charge to ground, whereby an a.c. voltage is generated;
   e. fifth means coupled to said fourth means for rectifying the a.c. voltage signal; and
   f. sixth means coupled to said fifth means for filtering the rectified a.c. voltage signal.

2. The apparatus as recited in claim 1 including seventh means coupled to said fifth and sixth means for clamping the voltage signal to a predetermined minus value.

3. In a metal-oxide semiconductor (MOS) memory array associated with a data processing unit wherein information in groups of memory elements is to be refreshed by a refresh means, apparatus for providing negative bias to said (MOS) memory elements comprising:
   a. a capacitor;
   b. first means in said (MOS) memory array for providing rectangular wave refresh clock signals;
   c. second means, responsive to said first means and coupled to said capacitor for alternately charging and discharging said capacitor in response to the refresh clock signals thus generating an a.c. voltage signal; and,
   d. third means, coupled to said capacitor for rectifying said a.c. voltage signal.

4. The apparatus as recited in claim 3 including fifth means coupled to said fourth means for clamping the voltage to a predetermined negative level.

5. The apparatus as recited in claim 4 including sixth means coupled to said fifth means for filtering the negative bias voltage.

6. A method of providing negative bias to a MOS memory said MOS memory associated with a data processing unit wherein information in groups of memory elements is to be refreshed by said refresh apparatus, said method comprising:
   a. generating rectangular refresh signals within said MOS memory;
   b. generating, in response to said refresh signals, a.c. voltage signals;
   c. rectifying said a.c. voltage signals;
   d. filtering the voltage signals;
   e. clamping the generated voltage to a predetermined minus value.

* * * * *